(12) United States Patent
Ahlgren et al.

(10) Patent No.: US 9,103,564 B2
(45) Date of Patent: Aug. 11, 2015

(54) SOLAR ENERGY CONVERTER AND METHOD FOR CONVERTING SOLAR ENERGY

(75) Inventors: Ralph B. Ahlgren, San Jose, CA (US); Klaus Petry, San Jose, CA (US); A. Michael Flores, San Jose, CA (US)

(73) Assignee: SOLEEVA CORPORATION, San Jose, CA (US)

( * ) Notice: Subject to any disclaimer, the term of this patent is extended or adjusted under 35 U.S.C. 154(b) by 878 days.

(21) Appl. No.: 12/905,349

(22) Filed: Oct. 15, 2010

(65) Prior Publication Data

US 2011/0088753 A1  Apr. 21, 2011

Related U.S. Application Data

(60) Provisional application No. 61/252,635, filed on Oct. 16, 2009.

(51) Int. Cl.
| | |
|---|---|
| *H01L 31/052* | (2014.01) |
| *F24J 2/24* | (2006.01) |
| *F24J 2/04* | (2006.01) |
| *H01L 31/042* | (2014.01) |
| *H01L 31/0525* | (2014.01) |
| *F24J 2/20* | (2006.01) |
| *F24J 2/46* | (2006.01) |
| *H02S 40/44* | (2014.01) |
| *F24J 2/00* | (2014.01) |

(52) U.S. Cl.
CPC .............. *F24J 2/0477* (2013.01); *F24J 2/202* (2013.01); *F24J 2/4647* (2013.01); *H01L 31/0422* (2013.01); *H01L 31/058* (2013.01); *H02S 20/00* (2013.01); *H02S 40/44* (2014.12); *F24J 2002/0092* (2013.01); *F24J 2002/467* (2013.01); *Y02E 10/44* (2013.01); *Y02E 10/50* (2013.01); *Y02E 10/60* (2013.01)

(58) Field of Classification Search
CPC ......... F24J 2/0477; F24J 2/242; F24J 2/4647; F24J 2002/0092; F24J 2002/467; H01L 31/0422; H01L 31/058
USPC .......................................... 136/246, 248, 253
See application file for complete search history.

(56) References Cited

U.S. PATENT DOCUMENTS

| | | | |
|---|---|---|---|
| 5,522,944 A | 6/1996 | Elazari | |
| 7,956,278 B1 * | 6/2011 | Popovich | 136/246 |
| 2002/0189662 A1 * | 12/2002 | Lomparski | 136/246 |
| 2003/0075213 A1 * | 4/2003 | Chen | 136/246 |
| 2004/0025931 A1 * | 2/2004 | Aguglia | 136/246 |

(Continued)

*Primary Examiner* — Matthew Martin
(74) *Attorney, Agent, or Firm* — Foster Pepper PLLC; Richard A. Koske; P. G. Scott Born

(57) ABSTRACT

The solar energy converter for generating electric energy and heated fluid comprises a multi-layer assembly, a photovoltaic panel and a manifold assembly. The multi-layer assembly is a casing and comprises N layers separated by at least one separator floor, each layer has at least one channel adapted to contain a fluid stream, and each layer has a first opening and a second opening. The photovoltaic panel has a top surface and a bottom surface, the bottom surface of the photovoltaic panel contacts the multi-layer assembly. The manifold assembly comprises N passages for containing the fluid streams, the Kth passage is adapted to distribute the fluid stream to be heated into the channel of the Kth layer through the corresponding first opening and collect the heated fluid stream from the channel of the Kth layer through the corresponding second opening, wherein N is a positive integer, K is a positive integer less than or equal to N.

27 Claims, 16 Drawing Sheets

(56) References Cited

U.S. PATENT DOCUMENTS

| | | | |
|---|---|---|---|
| 2005/0133082 A1* | 6/2005 | Konold et al. | 136/246 |
| 2006/0118163 A1* | 6/2006 | Plaisted et al. | 136/251 |
| 2007/0186922 A1* | 8/2007 | Guenter | 126/651 |
| 2008/0006323 A1* | 1/2008 | Kalkanoglu et al. | 136/253 |
| 2008/0302405 A1* | 12/2008 | Intrieri | 136/246 |
| 2009/0314335 A1* | 12/2009 | McClintock | 136/251 |

\* cited by examiner

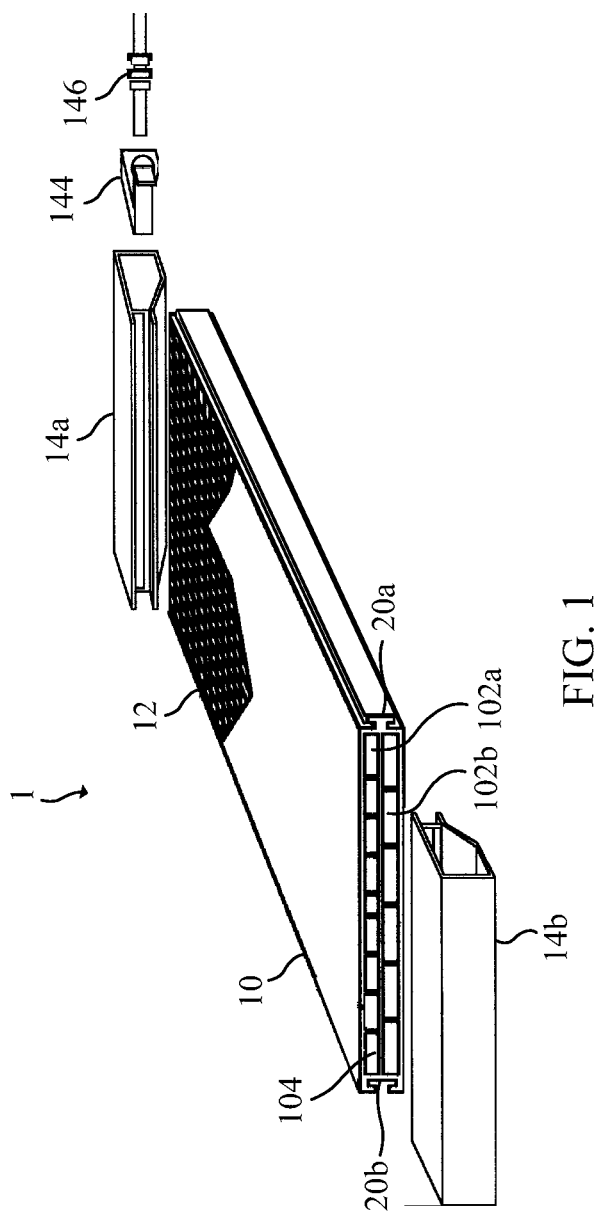

SOLAR ENERGY CONVERTER AND METHOD FOR CONVERTING SOLAR ENERGY

This application is a utility patent application that claims priority to U.S. Provisional Patent Application having Ser. No. 61/252,635, filed Oct. 16, 2009, which is entirely incorporated herein by reference.

BACKGROUND OF THE INVENTION

1. Field of the Invention

The invention is related to a solar energy converter. More particularly, the invention is related to the solar energy converter for generating electric energy and heated fluid.

2. Description of the Prior Art

In general, traditional solar panels may have photovoltaic arrays placed on a flat plate for converting solar energy to electric energy, a series of tubes are secured to the flat plate for collecting solar radiation onto to the flat plate and the photovoltaic arrays, and water to be heated is circulated through these tubes to extract the heat received by the photovoltaic arrays and the flat plate. Furthermore, the water circulated through these tubes may be used as a coolant for taking away the heat generated by the photovoltaic arrays.

For example, U.S. Pat. No. 5,522,944 describes a multi-purpose solar energy conversion system for converting solar energy to thermal and electrical energy, said system includes an array of photovoltaic cells for converting solar energy to electrical energy, and a plurality of interconnected heat collecting tubes disposed on the same plane as the array of photovoltaic cells for converting solar energy to thermal energy in a fluid disposed within the heat collecting tubes. However, the system employs the tubes/pipes which are complicated to fabricate and failed to provide a fast and efficient way to assemble the entire system.

Besides, the system also suffers from cold and icy conditions, where the temperature is such that circulating water in the panel may freeze and burst the pipes. Thus, the complicated tubes/pipes shall be a problem for maintaining such system. There is therefore an unresolved need in the art for a simple, reliable and inexpensive system without complicated tubes/pipes for converting solar energy to thermal and electric energy.

SUMMARY OF THE INVENTION

A purpose of the present invention is to provide a simple, reliable and inexpensive solar energy converter without complicated tubes/pipes for generating electric energy and heated fluid.

In accordance with the embodiment, the solar energy converter for generating electric energy and heated fluid comprises a multi-layer assembly, a photovoltaic panel and a manifold assembly. The multi-layer assembly is a casing and comprises N layers separated by at least one separator floor, each layer has at least one channel adapted to contain a fluid stream, and each layer has a first opening and a second opening. The photovoltaic panel has a top surface and a bottom surface, the bottom surface of the photovoltaic panel contacts the multi-layer assembly, the photovoltaic panel comprises a plurality of photovoltaic cells, disposed on the top surface, for gathering solar energy and converting the incident solar energy into electric energy, whereby the heating of the multi-layer assembly and the photovoltaic panel rises temperature of the fluid streams within each layer of the multi-layer assembly. The manifold assembly, detachably engaged with the multi-layer assembly, comprises N passages for containing the fluid streams, the Kth passage is adapted to distribute the fluid stream to be heated into the channel of the Kth layer through the corresponding first opening and collect the heated fluid stream from the channel of the Kth layer through the corresponding second opening, wherein N is a positive integer, K is a positive integer less than or equal to N.

In addition, the manifold assembly can be physically separated into a first manifold unit and a second manifold unit, the first manifold unit has N first passages, each of the first passages is adapted to align with the corresponding first opening of the multi-layer assembly, the second manifold unit has N second passages, each of the second passages is adapted to align with the corresponding second opening of the multi-layer assembly. Besides, each of the first passages of the first manifold unit comprises a first chamber and a first valve, the first chamber receives the fluid stream from a fluid source, and the first valve is adapted to align with the first opening of the channel of the corresponding layer for distributing the fluid stream to be heated into the channel of the corresponding layer. Moreover, the first chamber is a tubular space penetrating the first manifold unit and sealed by two end blocks at both ends, and at least one of the end blocks has an aperture thereon adapted to be detachably engaged with a connector for transporting the fluid stream from the fluid source to the first chamber.

A purpose of the present invention is to provide method for generating electric energy and heated fluid. Said method comprises the following steps: providing a photovoltaic panel comprising a plurality of photovoltaic cells for gathering solar energy and converting the incident solar energy into electric energy; providing a multi-layer assembly comprising N layers, each layer adapted to contain a fluid stream; distributing the fluid streams to be heated into the N layers; rising temperature of the fluid streams within each layer of the multi-layer assembly by the heating of the multi-layer assembly and the photovoltaic panel; collecting the heated fluid stream from the N layers, wherein N is a positive integer.

A purpose of the present invention is to provide a simple, reliable and inexpensive solar energy conversion system without complicated tubes/pipes for generating electric energy and heated fluid.

In accordance with the embodiment, the solar energy conversion system comprises a mounting frame, a plurality of solar energy converters, an umbilical connecting device. The plurality of solar energy converters are detachably fixed on the mounting frame respectively.

Each of the solar energy converter comprises a multi-layer assembly, a photovoltaic panel and a manifold assembly. The multi-layer assembly is a casing and comprises N layers separated by at least one separator floor, each layer has at least one channel adapted to contain a fluid stream, and each layer has a first opening and a second opening. The photovoltaic panel has a top surface and a bottom surface, the bottom surface of the photovoltaic panel contacts the multi-layer assembly, the photovoltaic panel comprises a plurality of photovoltaic cells, disposed on the top surface, for gathering solar energy and converting the incident solar energy into electric energy, whereby the heating of the multi-layer assembly and the photovoltaic panel rises temperature of the fluid streams within each layer of the multi-layer assembly. The manifold assembly, detachably engaged with the multi-layer assembly, comprises N passages for containing the fluid streams, the Kth passage is adapted to distribute the fluid stream to be heated into the channel of the Kth layer through the corresponding first opening and collect the heated fluid stream from the channel of the Kth layer through the corresponding second opening, wherein N is a positive integer, K is a positive integer less than or equal to N.

Besides, the umbilical connecting device physically combines the passages of at least two the manifold assemblies of the plurality of solar energy converters for sharing the fluid streams contained therein.

Accordingly, the solar energy converter of the present invention eliminates the need to utilize assembled piping, such as copper piping, internally under the photovoltaic panel. The multi-layer assembly and the manifold assembly can be manufactured in one step respectively, and the solar energy conversion system provides a user to easily assemble multiple units of the system by mounting them on the frame to accommodate the user's needs.

The objective of the present invention will no doubt become obvious to those of ordinary skill in the art after reading the following detailed description of the preferred embodiment, which is illustrated in following figures and drawings.

BRIEF DESCRIPTION OF THE APPENDED DRAWINGS

FIG. 1 illustrates a 3D diagram of a solar energy converter according to an embodiment of the invention.

DETAILED DESCRIPTION OF THE INVENTION

Figure 2A:
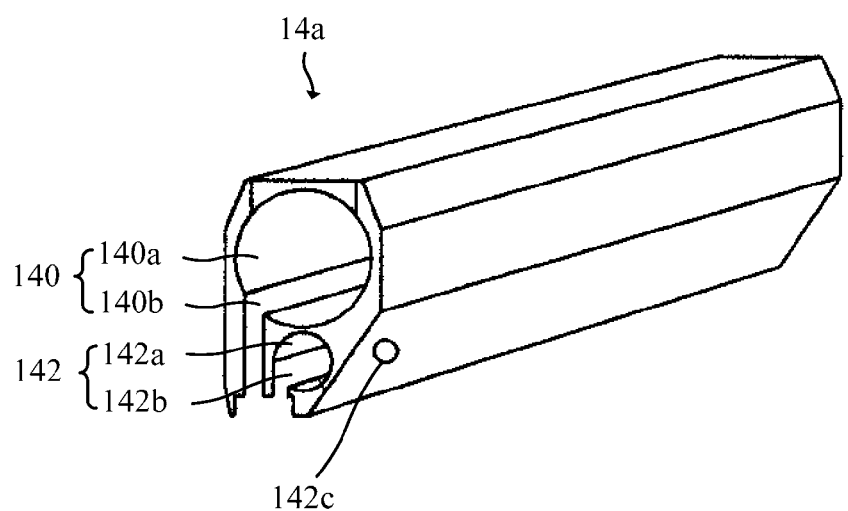
FIG. 2a illustrates a 3D diagram of the first manifold unit according to an embodiment of the invention.

Please refer to FIG. 1, FIG. 1 illustrates a 3D diagram of a solar energy converter according to an embodiment of the invention. As shown in FIG. 1, the solar energy converter 1 has a multi-layer assembly 10, a photovoltaic panel 12, a manifold assembly comprising a first manifold unit 14a and a second manifold unit 14b.

The multi-layer assembly 10 is a casing and comprises N layers separated by a plurality of separator floors, N is a positive integer. For example, the multi-layer assembly 10 has two layers, first layer 102a and second layer 102b, in this embodiment, and the two layers are separated by a separator floor 104. In practice, each of the N layers of the multi-layer assembly 10 shall be parallel to one another, and each layer has several channels adapted to contain a fluid stream. For example, the first layer 102a may be adapted to contain water stream and the second layer 102b may be adapted to contain air stream. The channels of all the layers form a pattern of honey-comb in a cross-sectional view along an extension direction of the channels. The channels can also be separated by the separator floor 104, that is, the separator floor 104 can be manufactured in certain pattern for creating the N-layer structure and the channels within each layer.

In addition, the multi-layer assembly 10 is made of aluminum and manufactured by an aluminum extrusion process. The material of the multi-layer assembly 10 is generally constructed of extruded high strength aluminum alloy to assure long life, more specifically, the material of the multi-layer assembly 10 shall preferably be 6061 or 6063 aluminum. It should be mentioned that the multi-layer assembly 10 can be, but not limited to, made of any suitable ductile metal or material. Those skilled in the art can replace aluminum with other appropriate materials. By using an extruded aluminum multi-layer assembly 10, costly individual tube assemblies and frames can be avoided. Moreover, the jointless design of the multi-layer assembly 10 can reduce fluid leakages of those layers and potential failure points.

Furthermore, the multi-layer assembly 10 can be coated with a surface coating for enhancing protection from corrosive atmospheres and absorption of the infra-red spectrum of the incident solar energy. In practice, the multi-layer assembly 10 can be coated with a hard black anodizing to attract maximum heat from the sun's rays and improve absorption of solar radiation. Those skilled in the art can understand that the surface coating can further be powder coating, anodizing or other methods or materials. These coatings may contain carbon nano materials to enhance coating lifetimes, enhance energy absorption and provide enhanced thermal transfer between the photovoltaic panel 12 and the multi-layer assembly 10. Besides, the surface coating can cover entire or partial exterior of the multi-layer assembly 10, and the multi-layer assembly 10 can be arranged with its blackened surface facing the sun and sloped at a suitable angle to optimize the solar energy collected. The backside of the multi-layer assembly 10 can be insulated by a layer of insulating material such as glass wool or plastic foam.

The photovoltaic panel 12 has a top surface and a bottom surface, the bottom surface of the photovoltaic panel 12 contacts the multi-layer assembly 10, the photovoltaic panel 12 comprises a plurality of photovoltaic cells, disposed on the top surface, for gathering solar energy and converting the incident solar energy into electric energy, whereby the heating of the multi-layer assembly 10 and the photovoltaic panel 12 rises temperature of the fluid streams within each layer of the multi-layer assembly 10. In practice, the photovoltaic panel 12 does not necessarily cover the entire top surface of the multi-layer assembly 10, and the plurality of photovoltaic cells can be bonded to the top surface randomly or in array. The photovoltaic panel 12 can be further covered by tempered glass (not shown in figures) coated with anti-reflective coatings to enhance light transmission.

The manifold assembly can be detachably engaged with the multi-layer assembly 10. In practice, the manifold assembly comprises two physically separated manifold units, the first manifold unit 14a and the second manifold unit 14b, for containing the fluid streams. The inner structures of the first manifold unit 14a and the second manifold unit 14b are substantially the same. The first manifold unit 14a and the second manifold unit 14b can also be manufactured by the extrusion process mentioned above.

Please refer to FIG. 1 and FIG. 2a, FIG. 2a illustrates a 3D diagram of the first manifold unit 14a according to an embodiment of the invention. As shown in figures, the first manifold unit 14a has two first passages, passage 140 and 142. In practice, the first passage 140 has two parts, a first chamber 140a and a first valve 140b respectively, the first chamber 140a receives the fluid stream from a fluid source (not shown in figures), and the first valve 140b is adapted to align with the first opening of the corresponding layer for distributing the fluid stream to be heated into the channel of the corresponding layer. For example, the first passage 140 contains water stream, the first chamber 140a receives the water stream from a water tank or a water supply, and the first valve 140b distributes the water stream into the first layer 102a. Similarly, the first passage 142 contains air stream in the first chamber 142a, and the first valve 142b distributes the air stream into the second layer 102b.

Figure 2B:
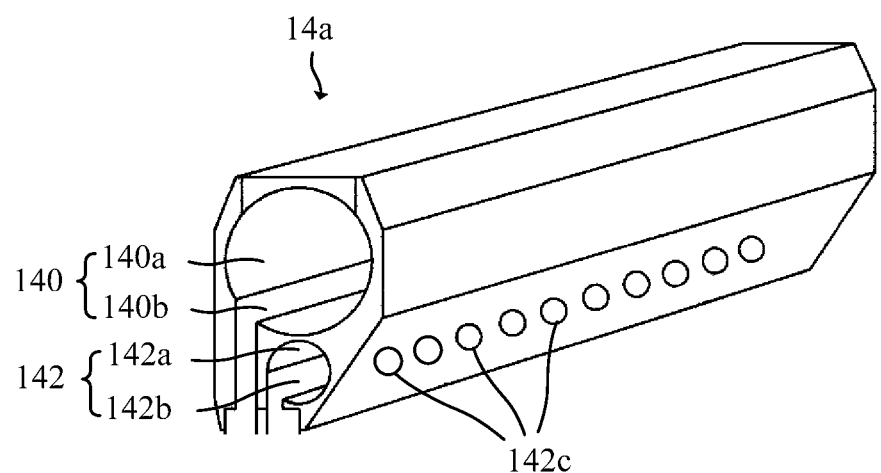
FIG. 2b illustrates a 3D diagram of the first manifold unit according to another embodiment of the invention.

Specifically, the first chambers 140a and 142a are tubular spaces penetrating the first manifold unit 14a. For example, the first chambers 140a can be sealed by two end blocks 144 at both ends, and at least one of the end blocks 144 has an aperture thereon adapted to be detachably engaged with a connector 146 for transporting the water stream from the water supply to the first chamber 140a. It should be noticed that the fluid stream can be infused into the first chamber without using the end block 144. Please refer to FIG. 2a and FIG. 2b, FIG. 2b illustrates a 3D diagram of the first manifold unit 14a according to another embodiment of the invention. As shown in FIG. 2a and FIG. 2b, the first manifold unit 14a can further comprises one or several air intakes 142c connected the first chamber 142a for receiving air stream from outside. In this case, the air intake 142c can be integrated with a filter screen to keep the impurities in air from getting inside the first chamber 142a.

The manifold assembly also incorporates a specialized spray device enable an external self-cleaning feature in the design to remove foreign debris from the top surface of the photovoltaic panel 12 and the multi-layer assembly 10 which might cause shadowing on the photovoltaic cells and lead to under performance of the entire array.

Figure 2C:
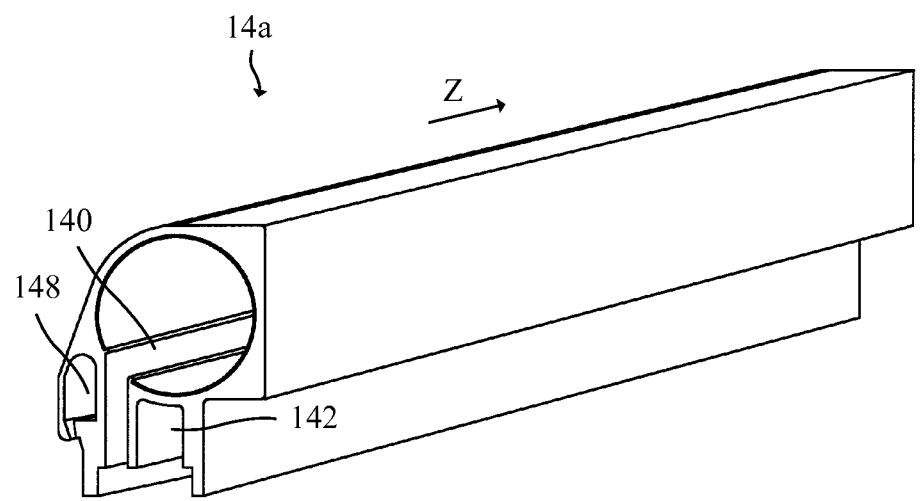
FIG. 2c illustrates a 3D diagram of the first manifold unit according to the other embodiment of the invention.
Figure 2D:
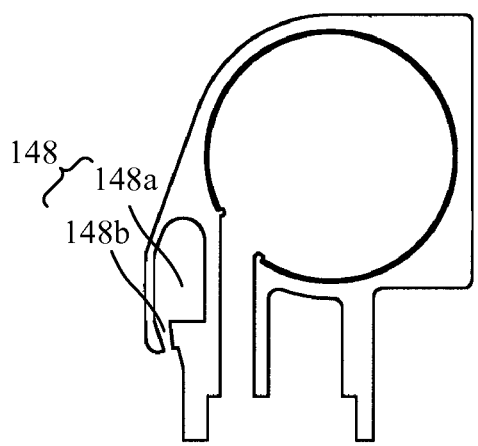
FIG. 2d illustrates a sectional drawing along direction Z in FIG. 2c.

Please refer to FIG. 2c and FIG. 2d, FIG. 2c illustrates a 3D diagram of the first manifold unit 14a according to the other embodiment of the invention. FIG. 2d illustrates a sectional drawing along direction Z in FIG. 2c. As shown in FIG. 2c and FIG. 2d, the first manifold unit 14a comprises a cleaning passage 148 for cleaning the photovoltaic panel 12, the cleaning passage comprises a cleaning chamber 148a and a cleaning valve 148b, the cleaning valve 148b is substantially align with the top surface of the photovoltaic panel 12, the cleaning chamber 148a contain water for gushing out of the cleaning valve 148b to clean the photovoltaic panel 12.

In general, an O-ring or similar device can be further disposed between the first manifold unit 14 and the multi-layer assembly 10 for sealing the fluid stream within the first passage and the channel of the corresponding layer.

Figure 3A:
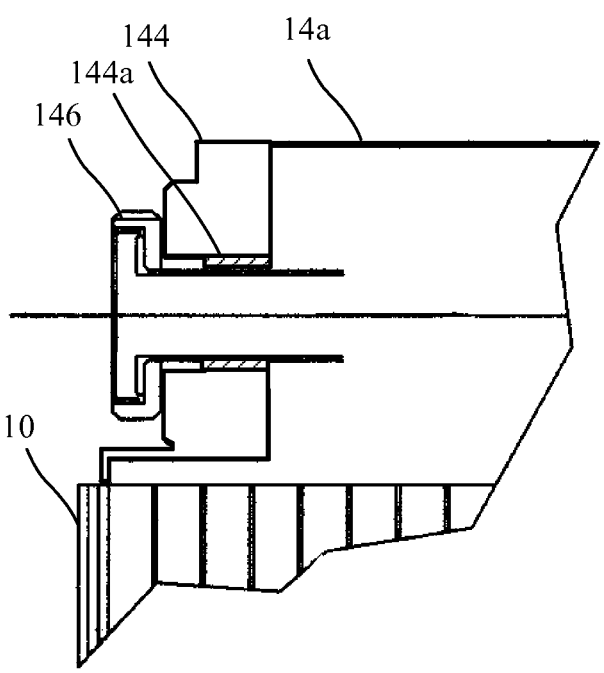
FIG. 3a illustrates a lateral view of the end block and a part of the connector according to an embodiment of the invention.

Regards to details of the end block 144 and the connector 146, please refer to FIG. 3a, FIG. 3a illustrates a lateral view of the end block 144 and a part of the connector 146 according to an embodiment of the invention. As shown in FIG. 3, the end block 144 located at one end of the first manifold unit 14a for sealing the first chambers 140a, the end block 144 has an aperture thereon adapted to be detachably engaged with a connector 146. Specifically, the end block 144 can also comprises an O-ring 144a to avoid fluid leakage while connecting the connector 146.

Figure 3B:
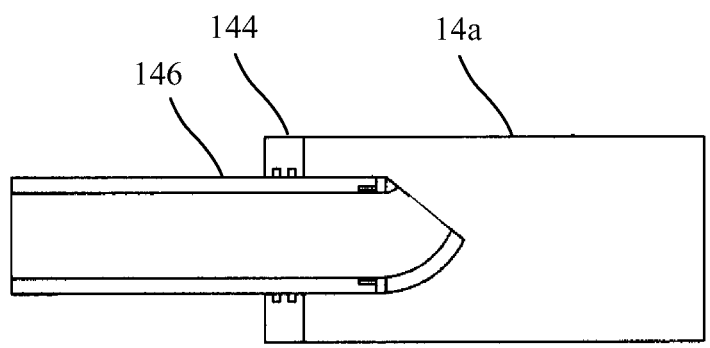
FIG. 3b illustrates a schematic diagram of the end block and a part of the connector according to another embodiment of the invention.

In addition, the connector 146 can comprises a vaned or finned intake tube inserted into the aperture of the end block 144 to create a turbulent flow in the fluid stream for increasing a heat transfer efficiency. Please refer to FIG. 3b, FIG. 3b illustrates a schematic diagram of the end block 144 and a part of the connector 146 according to another embodiment of the invention. The connector 146 comprises a bent intake tube converts a portion of the mechanical energy of the circulating fluid stream to generate a turbulent flow environment in the fluid stream to enhance heat transfer between the photovoltaic cells and the fluid stream, preventing sedimentation and making the unit self cleaning.

Figure 4:
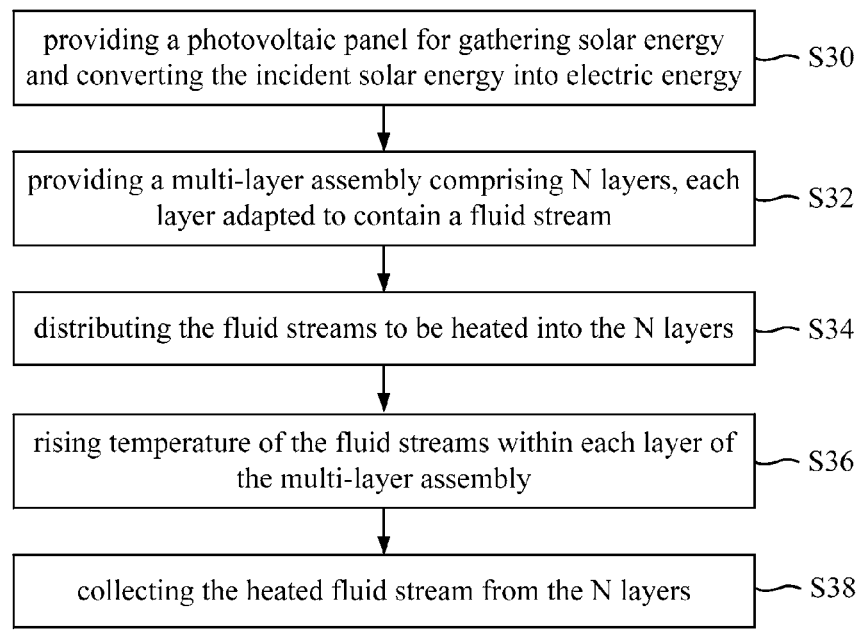
FIG. 4 illustrates a flow chart according to an embodiment of the method of the present invention.

The solar energy converter 1 can be further realized via the method of the present invention. Please refer to FIG. 1 and FIG. 4, FIG. 4 illustrates a flow chart according to an embodiment of the method of the present invention. As shown in figures, in step S30, the photovoltaic panel 12 is provided for gathering solar energy and converting the incident solar energy into electric energy. In general, the solar energy converter 1 can separate the solar energy into three separate energy streams. The photovoltaic panel 12 comprises a plurality of photovoltaic cells placed on the sun facing surface of the photovoltaic panel 12 for converting the incident solar energy into electric energy. In step S32, a multi-layer assembly 10 is provided for contain fluid streams. In practice, the multi-layer assembly 10 comprising N layers, each layer adapted to contain a fluid stream.

In step S34, the first manifold unit 14a distributes the fluid streams to be heated into the N layers of the multi-layer assembly 10. In step S36, the heating of the multi-layer assembly 10 and the photovoltaic panel 12 rises temperature of the fluid streams within each layer of the multi-layer assembly 10, that is, the fluid streams within each layer of the multi-layer assembly 10 taking away the heat generated by the photovoltaic panel 12 during the conversion of thermal-electric energy and the heat incident into the multi-layer assembly 10 directly. Moreover, the efficiency of the photovoltaic panel 12 can be increased by cooling and maintaining a constant temperature throughout the daily solar cycle and thus mitigating the heat induced efficiency losses characteristic of photovoltaic cells.

In step S38, the second manifold unit 14b collects the heated fluid stream from the N layers. In practice, the second manifold unit 14b can be connected to a heating, a radiator, a geyser, a water tank, or other appropriate device. The first manifold unit 14a can be connected to a fluid source for receiving the fluid stream. The second manifold unit 14b can also be connected to a suction pump to extract the air out of the corresponding layer. Hot air produced with the present invention can be used in agriculture for drying of fruits and vegetables.

Figure 5:
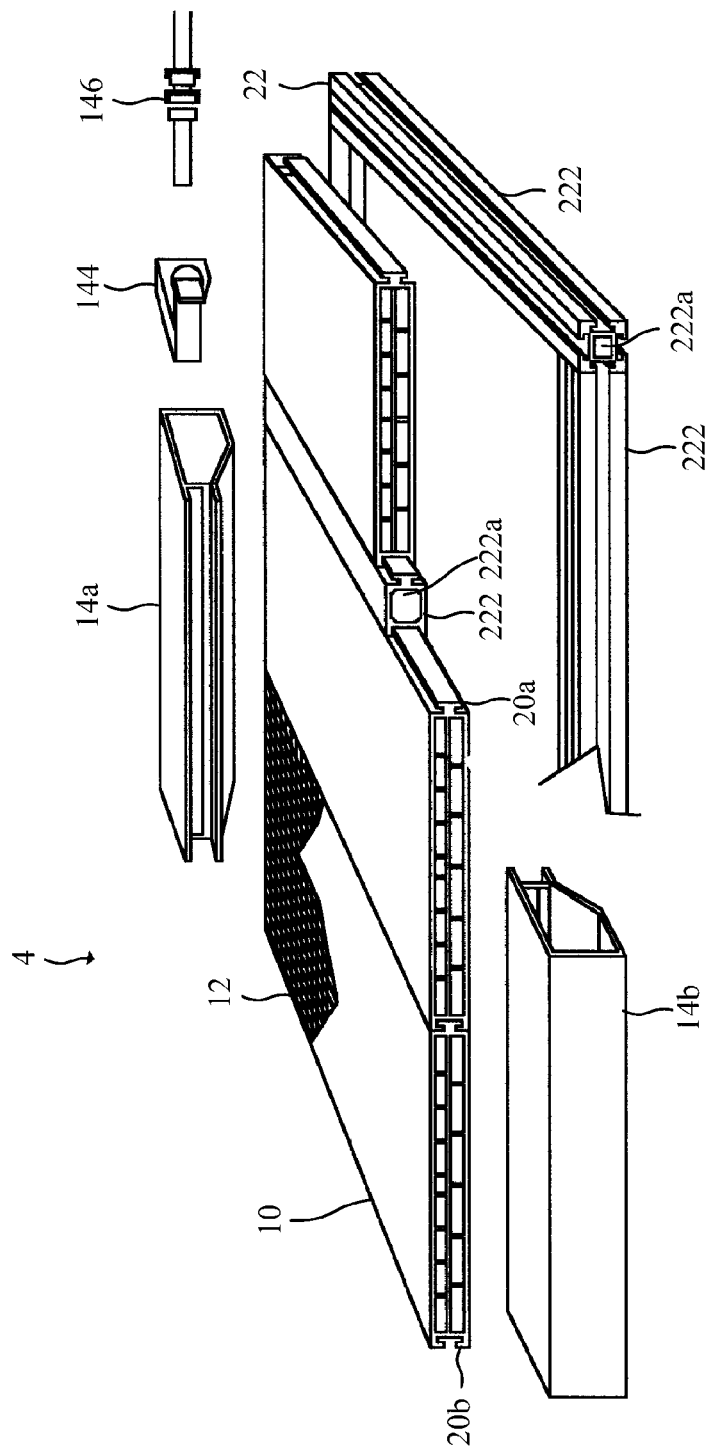
FIG. 5 illustrates a 3D diagram of a solar energy conversion system according to an embodiment of the invention.

The present invention also discloses a solar energy conversion system, please refer to FIG. 1 and FIG. 5. FIG. 5 illustrates a 3D diagram of a solar energy conversion system according to an embodiment of the invention. As shown in figures, the solar energy conversion system 4 comprises a plurality of solar energy converter 1, the details of the solar energy converter 1 are not repeated here. It should be noticed that the plurality of solar energy converters 1 can connect to each other by "T" rails 20a and corresponding "T" slots 20b.

Those skilled in the art can replace the "T" rails 20a and "T" slots 20b with other similar apparatus, for example a convex portion and a corresponding concave portion suitable to fix the convex portion. Therefore, the size of the solar energy conversion system 4 can be easily enlarged by connecting the plurality of solar energy converters 1.

The solar energy conversion system 4 comprises a mounting frame 22 having a plurality of risers 222 detachably engaged with one another. The solar energy converter 1 can be detachably mounted on the adjacent riser 222 by the same apparatus of the "T" rails and the corresponding "T" slots. Therefore, the connection of the solar energy conversion system 4 is very simple and easy by using the risers with the "T" rails and the corresponding "T" slots, and every solar energy converters 1 within the solar energy conversion system 4 can be located, aligned, and tight down with the mounting frame 22 at the same time.

In addition, the mounting frame 22 further comprises a groove and the solar energy converter 1 comprises a pin, the pin can be affixed to the sides of the solar energy converter 1 to locate into corresponding groove in the sides of the mounting frame 22 and also which allows for the solar energy converter 1 to be quickly mounted into the mounting frame 22.

Besides, the riser 222 may incorporate a tunnel 222a through the entire length of the riser 222. The tunnel 222a creates a vortex aides with a downward pressure reaction of the trapped wind inside the tunnel 222a. Therefore, the solar energy conversion system 4 can be disposed firmly on a roof or other windy place.

Figure 6:
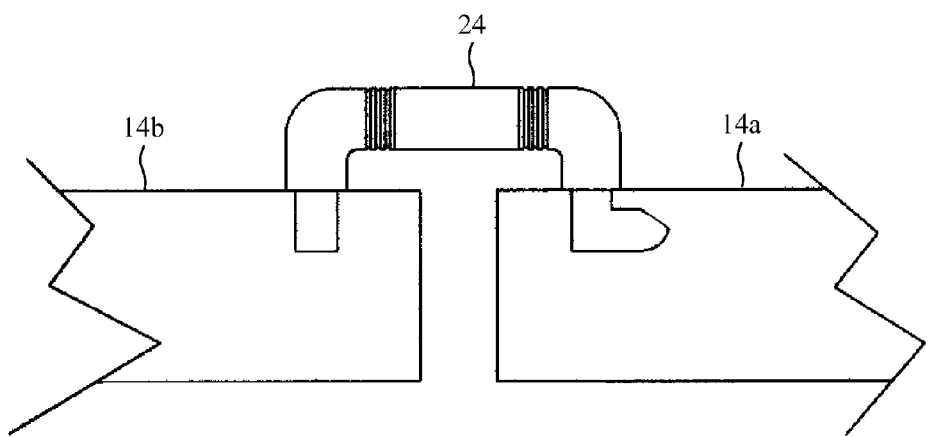
FIG. 6 illustrates a schematic diagram of an umbilical connecting device according to an embodiment of the invention.

Please refer to FIG. 5 and FIG. 6. FIG. 6 illustrates a schematic diagram of an umbilical connecting device according to an embodiment of the invention. As shown in figures, the solar energy conversion system 4 further comprises an umbilical connecting device 24 physically combining the passages of at least two the manifold assemblies of the plurality of solar energy converters 1 for sharing the fluid streams contained therein. In practice, the umbilical connecting device 24 connects the second manifold unit 14b of one solar energy converter 1 to the first manifold unit 14a of another solar energy converter 1. Thus, the fluid streams from the fluid sources or similar devices can be shared within all solar energy converters 1. It should be noticed that the plurality of solar energy converter 1 can be connected not only in series connections but also in parallel connections, that is, those skilled in the art can realize that the umbilical connecting device 24 can connect the second manifold unit 14b of one solar energy converter 1 to the plurality of first manifold units 14a of corresponding solar energy converters 1.

Figure 7A:
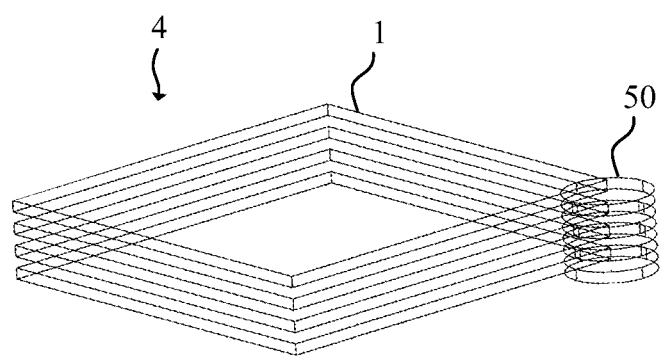
FIG. 7a illustrates a schematic diagram of a folded solar energy conversion system according to an embodiment of the invention.
Figure 7B:
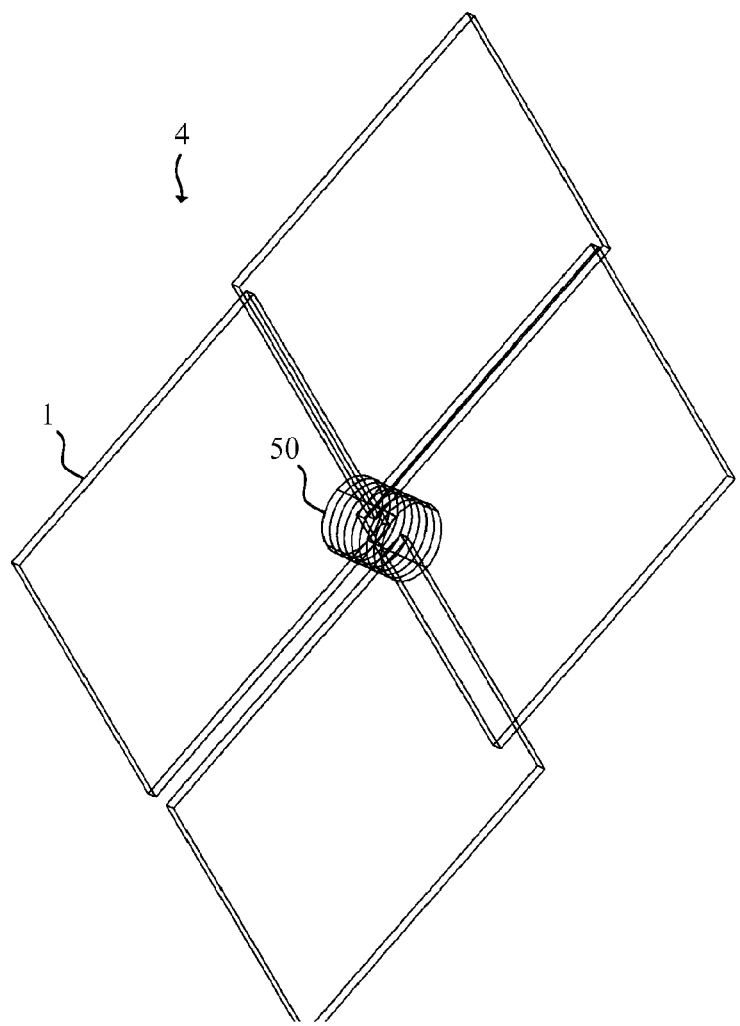
FIG. 7b illustrates a schematic diagram of the unfolded solar energy conversion system according to an embodiment of the invention.
Figure 7C:
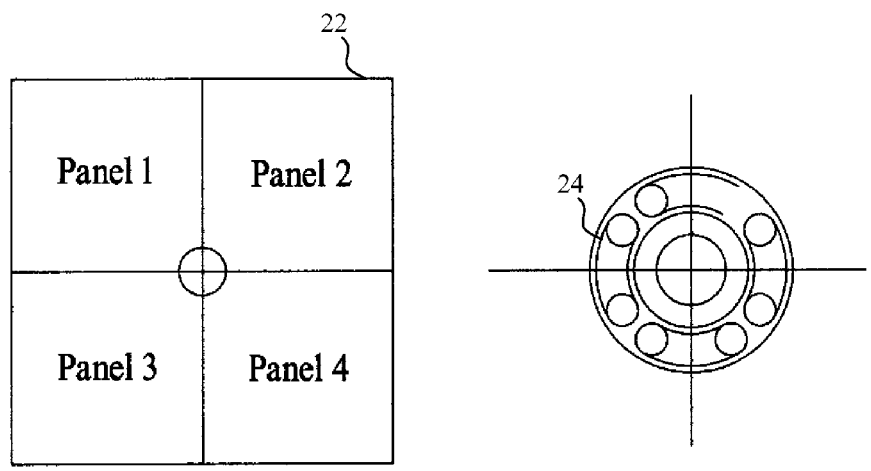
FIG. 7c illustrates a vertical view of FIG. 7b.

Those skilled in the art can further realize that the solar energy conversion system 4 is not necessarily a plane system. For example, the solar energy conversion system 4 can be folded to a small package as shown in FIG. 7a, FIG. 7b, and FIG. 7c. FIG. 7a illustrates a schematic diagram of a folded solar energy conversion system 4 according to an embodiment of the invention. FIG. 7a illustrates a schematic diagram of a folded solar energy conversion system 4 according to an embodiment of the invention. FIG. 7b illustrates a schematic diagram of the unfolded solar energy conversion system 4 according to an embodiment of the invention. FIG. 7c illustrates a vertical view of FIG. 7b. As shown in figures, the solar energy conversion system 4 comprises, for example, four solar energy converters 1, the manifold assembly of the solar energy converters 1, the mounting frame and the umbilical connecting device can be integrated inside a column 50. Specifically, small rotatable manifold assemblies are connected to each solar energy converters 1 and stacked inside the column 50. The umbilical connecting device applied in this embodiment shall be flexible and shielded tubes and cables. The amount of the solar energy converter 1 can vary and is not restricted to a particular number.

Figure 8:
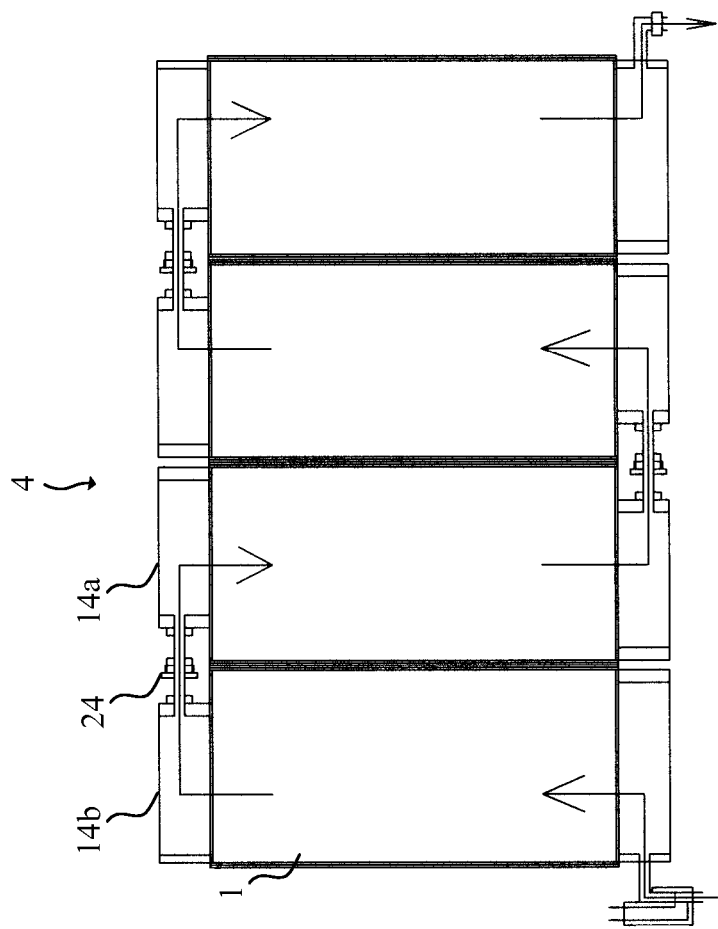
FIG. 8 illustrates a schematic diagram of another folded solar energy conversion system according to an embodiment of the invention.

FIG. 8 illustrates a schematic diagram of another folded solar energy conversion system 4 according to an embodiment of the invention. The solar energy conversion system 4 in this embodiment comprises several solar energy converters 1, and the adjacent solar energy converters 1 can double up and connect to each other by the flexible umbilical connecting device 24.

Figure 9:
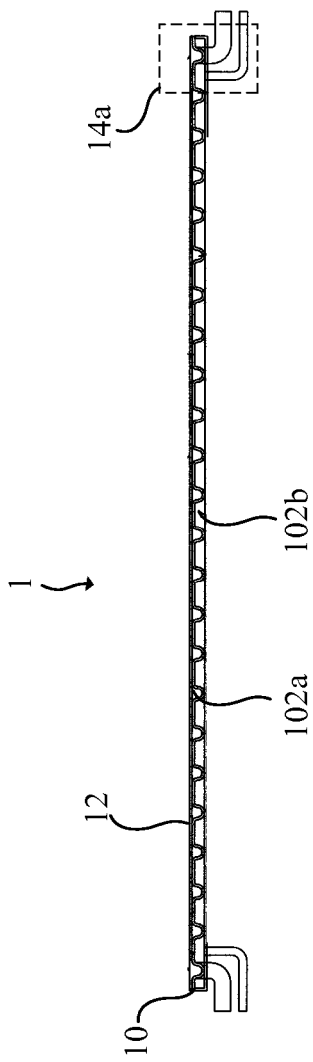
FIG. 9 illustrates a section view of a jagged multi-layer assembly according to an embodiment of the invention.

FIG. 9 illustrates a section view of a jagged multi-layer assembly according to an embodiment of the invention. As shown in FIG. 9, the channels of all the layers form a jagged pattern in a cross-sectional view along an extension direction of the channels. The multi-layer assembly 10 and the photovoltaic panel 12 can be detachably engaged with each other. Of course, the photovoltaic panel 12 can be the upper cover of the multi-layer assembly 10, that is, the multi-layer assembly 10 can only comprise a casing without the upper cover, and the layers within the multi-layer assembly 10 can be separated jagged separator floors. Further, the multi-layer assembly 10 and the photovoltaic panel 12 can be roll welded on the edges.

Figure 10:
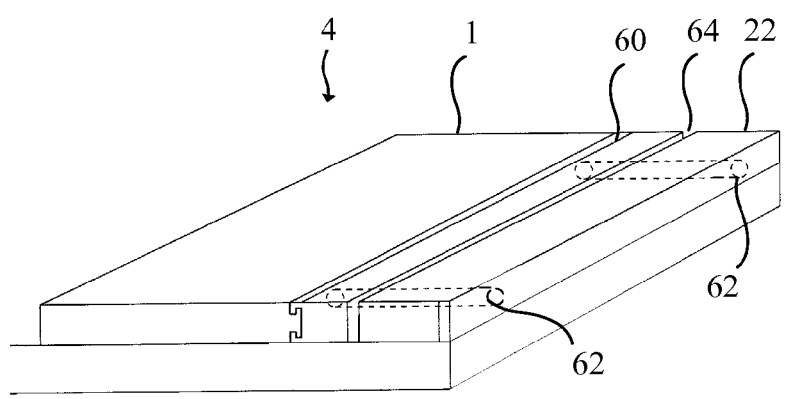
FIG. 10 illustrates a schematic diagram of an expansion feature according to an embodiment of the invention.

FIG. 10 illustrates a schematic diagram of an expansion feature according to an embodiment of the invention. As shown in FIG. 10, the solar energy converter 1 of the solar energy conversion system 4 can be detachably engaged with a buffer block 60, and springs 62 can be placed between the buffer block 60 and the mounting frame 22 and create an expansion gap 64, the expansion feature of the present invention can absorb the temperature changes of the material and have the ability to expand and extract.

To sum up, the present invention is to provide the solar energy converter eliminates the need to utilize assembled piping, such as copper piping, internally under the photovoltaic panel. The multi-layer assembly and the manifold assembly can be manufactured in one step respectively, and the solar energy conversion system provides a user to easily assemble multiple units of the system by mounting them on the mounting frame to accommodate the user's needs.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A solar energy converter for generating electric energy and heated fluid, comprising:
   a one piece multi-layer assembly formed by a metal extrusion process along an extension direction, the multi-layer assembly comprising N layers separated by a plurality of separator floors, each layer having a plurality of channels in the extension direction adapted to contain a fluid stream, and each layer having a first opening and a second opening;
   a photovoltaic panel having a top surface and a bottom surface, the bottom surface of the photovoltaic panel contacting the multi-layer assembly, the photovoltaic panel comprising a plurality of photovoltaic cells, disposed on the top surface, for gathering solar energy and converting the incident solar energy into electric energy, whereby the heating of the multi-layer assembly and the photovoltaic panel rises temperature of the fluid streams within each layer of the multi-layer assembly;

a manifold assembly, detachably engaged with the multi-layer assembly, comprising N passages for containing the fluid streams, the Kth passage adapted to distribute the fluid stream to be heated into each of the plurality of channels of the Kth layer through the corresponding first opening and collect the heated fluid stream from each of the plurality of channels of the Kth layer through the corresponding second opening, the manifold assembly comprising a connector having a finned, vaned or bent intake tube to create turbulent flow the fluid streams; and wherein N is a positive integer greater than 1, K is a positive integer less than or equal to N.

2. The solar energy converter of claim 1, wherein the fluid streams within the N layers comprise at least two types of fluid.

3. The solar energy converter of claim 1, wherein the multi-layer assembly is coated with a surface coating for enhancing protection from corrosive atmospheres and absorption of the infra-red spectrum of the incident solar energy.

4. The solar energy converter of claim 1, wherein each layer of the multi-layer assembly comprises the plurality of channels, the channels of all the layers form a pattern of honey-comb in a cross-sectional view along an extension direction of the channels.

5. The solar energy converter of claim 1, wherein the manifold assembly is physically separated into a first manifold unit and a second manifold unit, the first manifold unit has N first passages, each of the first passages is adapted to align with the corresponding first opening of the multi-layer assembly, the second manifold unit has N second passages, each of the second passages is adapted to align with the corresponding second opening of the multi-layer assembly.

6. The solar energy converter of claim 5, wherein the first manifold unit and the second manifold unit are manufactured by an extrusion process.

7. The solar energy converter of claim 5, wherein each of the first passages of the first manifold unit comprises a first chamber and a first valve, the first chamber receives the fluid stream from a fluid source, and the first valve is adapted to align with the first opening of the corresponding layer for distributing the fluid stream to be heated into the channel of the corresponding layer.

8. The solar energy converter of claim 7, wherein the first chamber is a tubular space penetrating the first manifold unit and sealed by two end blocks at both ends, and at least one of the end blocks has an aperture thereon adapted to be detachably engaged with a connector for transporting the fluid stream from the fluid source to the first chamber.

9. The solar energy converter of claim 8, wherein the connector comprises an intake tube inserted into the aperture of the end block to create a turbulent flow in the fluid stream for increasing a heat transfer efficiency.

10. The solar energy converter of claim 5, wherein each of the second passages of the second manifold unit comprises a second chamber and a second valve, the second valve is adapted to align with the second opening of the corresponding layer for collecting the heated fluid stream from the channel of the corresponding layer, and the second chamber temporarily contains the heated fluid stream to be conducted out of the solar energy converter.

11. The solar energy converter of claim 5, wherein the first manifold unit further comprises a cleaning passage for cleaning the photovoltaic panel, the cleaning passage comprises a cleaning chamber and a cleaning valve, the cleaning valve is substantially align with the top surface of the photovoltaic panel, the cleaning chamber contain water for gushing out of the cleaning valve to clean the photovoltaic panel.

12. A solar energy conversion system comprising:
a mounting frame;
a plurality of solar energy converters detachably fixed on the mounting frame respectively, each solar energy converter comprising:
a one piece multi-layer assembly formed by a metal extrusion process along an extension direction, the multi-layer assembly comprising N layers separated by a plurality of separator floors, each layer having a plurality of channels in the extension direction adapted to contain a fluid stream, and each layer having a first opening and a second opening;
a photovoltaic panel having a top surface and a bottom surface, the bottom surface of the photovoltaic panel contacting the multi-layer assembly, the photovoltaic panel comprising a plurality of photovoltaic cells, disposed on the top surface, for gathering solar energy and converting the incident solar energy into electric energy, whereby the heating of the multi-layer assembly and the photovoltaic panel rises temperature of the fluid streams within each layer of the multi-layer assembly;
a manifold assembly, detachably engaged with the multi-layer assembly, comprising N passages for containing the fluid streams, the Kth passage adapted to distribute the fluid stream to be heated into each of the plurality of channels of the Kth layer through the corresponding first opening and collect the heated fluid stream from each of the plurality of channels of the Kth layer through the corresponding second opening, the manifold assembly comprising a connector having a finned, vaned or bent intake tube to create turbulent flow the fluid streams; and
wherein N is a positive integer greater than 1, K is a positive integer less than or equal to N; and
an umbilical connecting device physically combining the passages of at least two of the manifold assemblies of the plurality of solar energy converters for sharing the fluid streams contained therein.

13. The solar energy conversion system of claim 12, wherein the fluid streams within the N layers comprise at least two types of fluid.

14. The solar energy conversion system of claim 12, wherein the multi-layer assembly is coated with a surface coating for enhancing protection from corrosive atmospheres and absorption of the infra-red spectrum of the incident solar energy.

15. The solar energy conversion system of claim 12, wherein each layer of the multi-layer assembly comprises the plurality of channels, the channels of all the layers form a pattern of honey-comb in a cross-sectional view along an extension direction of the channels.

16. The solar energy conversion system of claim 12, wherein the manifold assembly is physically separated into a first manifold unit and a second manifold unit, the first manifold unit has N first passages, each of the first passages is adapted to align with the corresponding first opening of the multi-layer assembly, the second manifold unit has N second passages, each of the second passages is adapted to align with the corresponding second opening of the multi-layer assembly.

17. The solar energy conversion system of claim 16, wherein the first manifold unit and the second manifold unit are manufactured by an extrusion process.

18. The solar energy conversion system of claim 16, wherein each of the first passages of the first manifold unit comprises a first chamber and a first valve, the first chamber receives the fluid stream from a fluid source, and the first valve is adapted to align with the first opening of the corresponding layer for distributing the fluid stream to be heated into the channel of the corresponding layer.

19. The solar energy conversion system of claim 18, wherein the first chamber is a tubular space penetrating the first manifold unit and sealed by two end blocks at both ends, and at least one of the end blocks has an aperture thereon adapted to be detachably engaged with a connector for transporting the fluid stream from the fluid source to the first chamber.

20. The solar energy conversion system of claim 19, wherein the connector comprises a bent intake tube inserted into the aperture of the end block to create a turbulent flow in the fluid stream for increasing a heat transfer efficiency.

21. The solar energy conversion system of claim 16, wherein each of the second passages of the second manifold unit comprises a second chamber and a second valve, the second valve is adapted to align with the second opening of the corresponding layer for collecting the heated fluid stream from the channel of the corresponding layer, and the second chamber temporarily contains the heated fluid stream to be gushed out of the solar energy converter.

22. The solar energy conversion system of claim 16, wherein the first manifold unit further comprises a cleaning passage for cleaning the photovoltaic panel, the cleaning passage comprises a cleaning chamber and a cleaning valve, the cleaning valve is substantially align with the top surface of the photovoltaic panel, the cleaning chamber contain water for gushing out of the cleaning valve to clean the photovoltaic panel.

23. The solar energy conversion system of claim 12, wherein the solar energy conversion system further comprises a micro-inverter, coupled to the photovoltaic panels respectively, for converting DC voltages generated by the photovoltaic panels into AC current.

24. The solar energy conversion system of claim 12, wherein the mounting frame comprises a plurality of holes to vent low pressure areas and reduce aerodynamic lift.

25. The solar energy conversion system of claim 12, wherein the mounting frame comprises a plurality of risers, detachably engaged with one another, for detachably fixing the adjacent solar energy converters thereon.

26. The solar energy conversion system of claim 25, wherein the riser comprises a mounting rail for detachably engaging the solar energy converter with a mounting slot corresponding to the mounting rail.

27. The solar energy conversion system of claim 12, wherein the mounting frame comprises at least one groove and the solar energy converter comprises at least one pin corresponding to the groove for detachably mounting the solar energy converter into the mounting frame.

* * * * *